(12) United States Patent
Hellberg

(10) Patent No.: US 9,484,863 B2
(45) Date of Patent: Nov. 1, 2016

(54) AMPLIFIER CIRCUIT AND METHOD

(71) Applicant: Telefonaktiebolaget L M Ericsson (publ), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 147 days.

(21) Appl. No.: 14/406,844

(22) PCT Filed: May 8, 2014

(86) PCT No.: PCT/SE2014/050565
§ 371 (c)(1),
(2) Date: Dec. 10, 2014

(87) PCT Pub. No.: WO2015/171026
PCT Pub. Date: Nov. 12, 2015

(65) Prior Publication Data
US 2016/0218681 A1 Jul. 28, 2016

(51) Int. Cl.
*H03F 1/02* (2006.01)
*H03F 3/60* (2006.01)
*H03F 3/19* (2006.01)

(52) U.S. Cl.
CPC ............ *H03F 1/0288* (2013.01); *H03F 3/19* (2013.01); *H03F 3/602* (2013.01); *H03F 2200/423* (2013.01); *H03F 2200/451* (2013.01)

(58) Field of Classification Search
CPC ....... H03F 1/0288; H03F 1/07; H03F 1/3252
USPC ............................................. 330/295, 124 R
See application file for complete search history.

(56) References Cited

U.S. PATENT DOCUMENTS 5,111,157 A   5/1992 Komiak
7,557,652 B2*  7/2009 Klingberg ............ H03F 1/0288
                                              330/124 R
(Continued)

FOREIGN PATENT DOCUMENTS

EP       2 362 541 A1     8/2011
WO   WO 2004/023647 A1   3/2004
(Continued)

OTHER PUBLICATIONS

International Search Report for International Application No. PCT/SE2014/050565 mailed Aug. 22, 2014, 5 pages.
(Continued)

*Primary Examiner* — Henry Choe
(74) *Attorney, Agent, or Firm* — Myers Bigel, P.A.

(57) ABSTRACT

First and second amplifiers are respectively coupled to first and second lines, each having first and second portions. An auxiliary amplifier has an output coupled to an auxiliary line network which comprises: a first auxiliary line coupled between an auxiliary junction and a first intersection between the first and second portions of the first line; a second auxiliary line coupled between the auxiliary junction and a second intersection between the first and second portions of the second line; and a third auxiliary line for coupling the output of the auxiliary amplifier to the auxiliary junction. Each of the first and second lines have a higher-impedance portion and a lower-impedance portion whose lengths are substantially equal. Lengths of the respective first portions of the first and second lines sum to half a wavelength, and lengths of the respective second portions of the first and second lines sum to half a wavelength.

16 Claims, 12 Drawing Sheets

(56) References Cited

U.S. PATENT DOCUMENTS

| | | | |
|---|---|---|---|
| 8,441,321 B2* | 5/2013 | Hellberg | H03F 1/0288 330/124 R |
| 8,717,099 B2 | 5/2014 | Wilson et al. | |
| 2005/0225385 A1* | 10/2005 | Merrill | H03F 3/602 330/124 D |
| 2006/0164163 A1* | 7/2006 | Apel | H03F 1/0277 330/151 |
| 2006/0192615 A1 | 8/2006 | Fraysse | |
| 2008/0007330 A1* | 1/2008 | Klingberg | H03F 1/0288 330/124 R |
| 2010/0315162 A1 | 12/2010 | Gajadharsing | |
| 2011/0175677 A1 | 7/2011 | Jeong et al. | |
| 2013/0154731 A1 | 6/2013 | Gajadharsing | |
| 2014/0062601 A1 | 3/2014 | Acimovic et al. | |

FOREIGN PATENT DOCUMENTS

| | | |
|---|---|---|
| WO | WO 2004/057755 A1 | 7/2004 |
| WO | WO 2010/074615 A1 | 7/2010 |
| WO | WO 2013/087232 A1 | 6/2013 |
| WO | WO 2014/193275 A1 | 12/2014 |
| WO | WO 2015/171027 A1 | 11/2015 |

OTHER PUBLICATIONS

Written Opinion of the International Searching Authority for International Application No. PCT/SE2014/050565 mailed Aug. 22, 2014, 3 pages.

International Search Report for International Application No. PCT/SE2014/050566 mailed Aug. 22, 2014, 5 pages.

Written Opinion of the International Searching Authority for International Application No. PCT/SE2014/050566 mailed Aug. 22, 2014, 3 pages.

Doherty: "A New High Efficiency Power Amplifier for Modulated Waves", Proceedings of the Institute of Radio Engineers, vol. 24, No. 9, Sep. 1936; p. 1163-1182.

Perreault: "A New Power Combining and Outphasing Modulation System for High-Efficiency Power Amplification", 2010 IEEE Midwest Symposium on Circuits and Systems, pp. 441-444, Aug. 2010; 4 pg.

Chireix: "High Power Outphasing Modulation", Proceedings of the Institute of Radio Engineers, vol. 23, No. 11, Nov. 1935, p. 1370-1392.

* cited by examiner

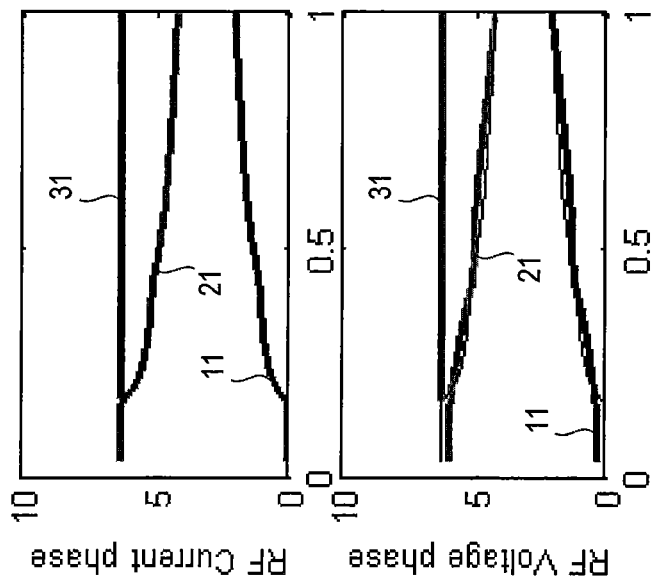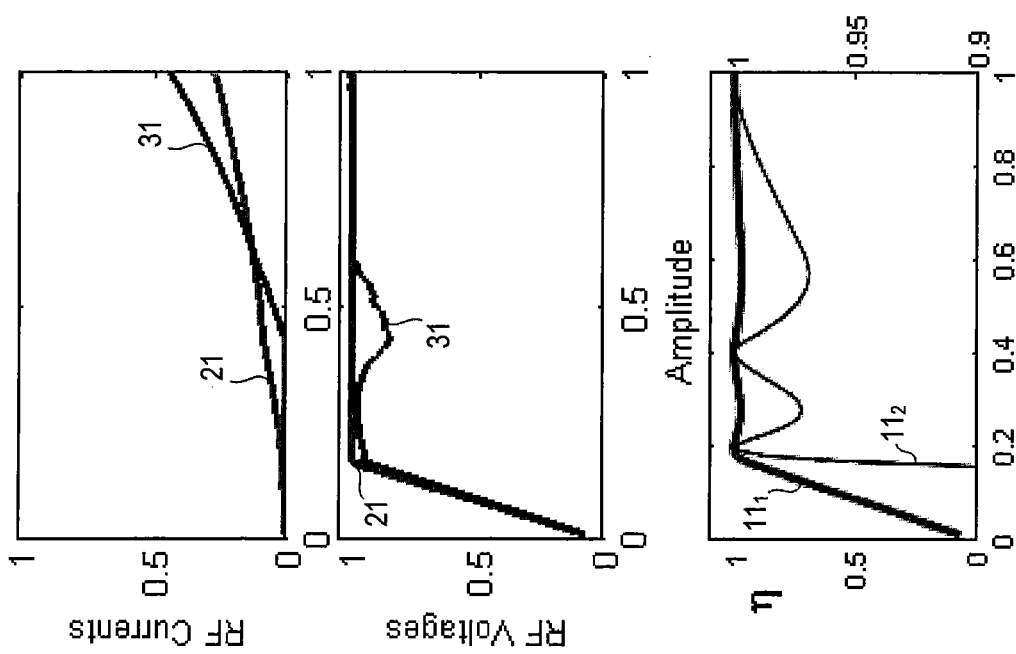

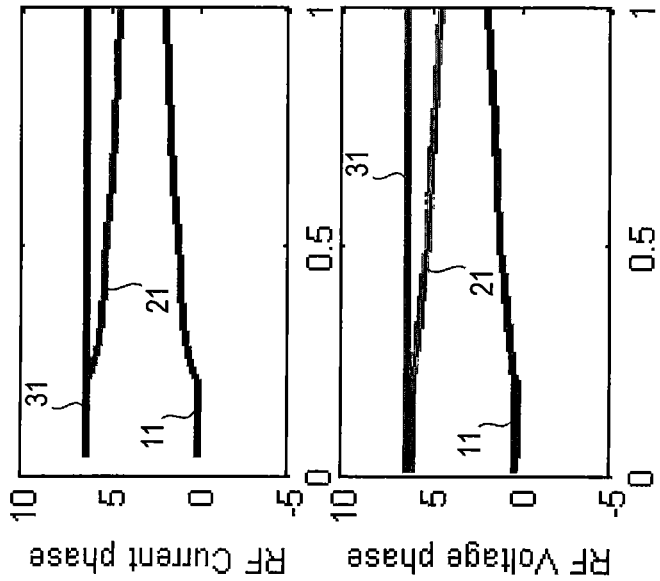
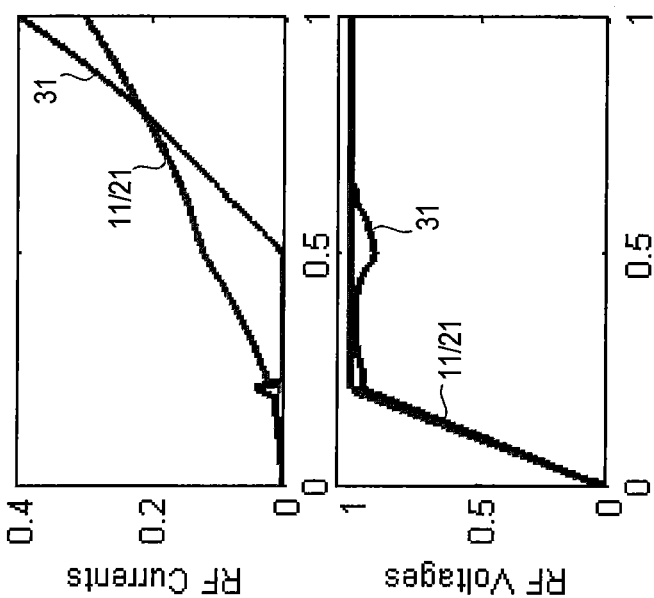
Fig. 3e
Fig. 3f
Fig. 3b
Fig. 3c
Fig. 3d

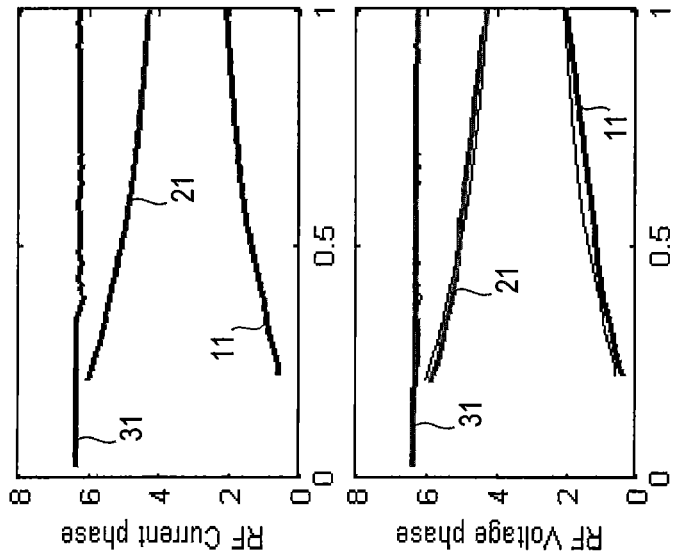
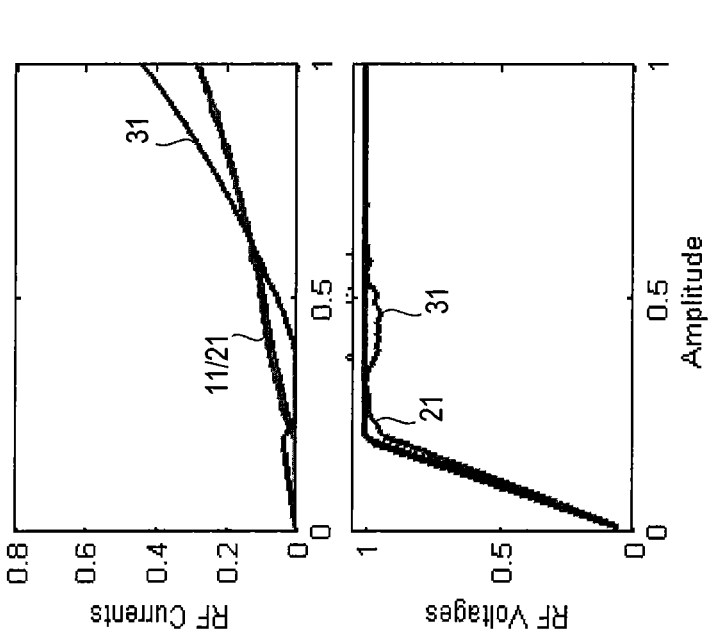
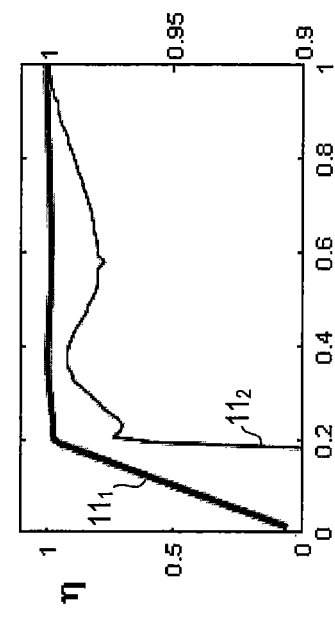
Fig. 4e
Fig. 4f
Fig. 4b
Fig. 4c
Fig. 4d

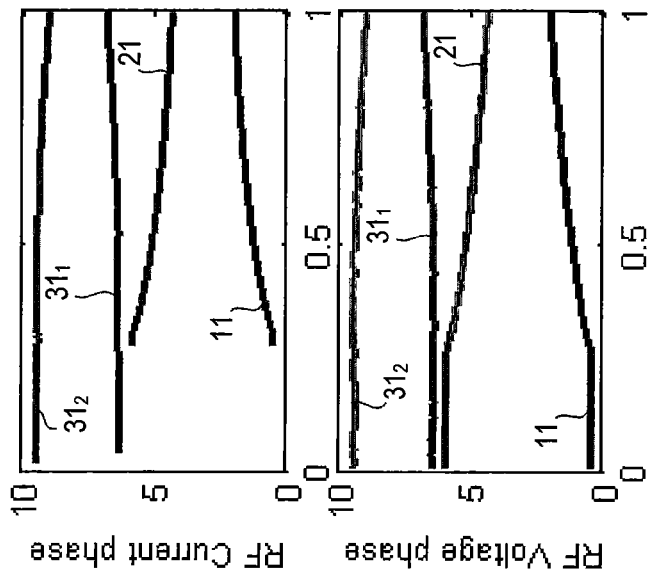
Fig. 6e
Fig. 6f
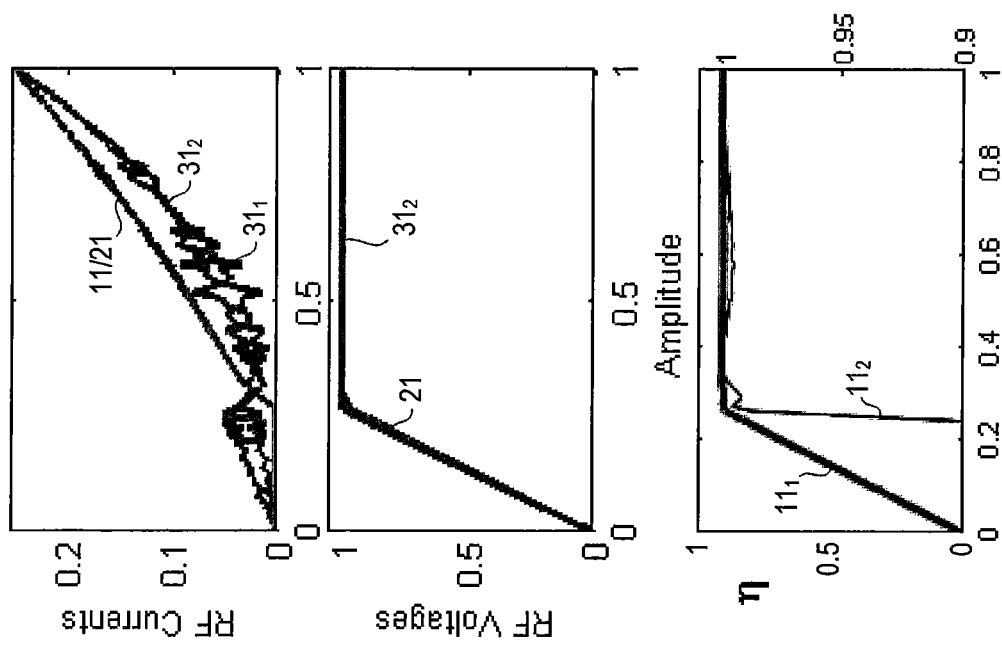
Fig. 6b
Fig. 6c
Fig. 6d

US 9,484,863 B2

AMPLIFIER CIRCUIT AND METHOD

CROSS REFERENCE TO RELATED APPLICATION

This application is a 35 U.S.C. §371 national stage application of PCT International Application No. PCT/SE2014/050565, filed in the English language on 8 May 2014, the disclosure and content of which is incorporated by reference herein in its entirety.

TECHNICAL FIELD

The present invention relates to an amplifier circuit and method, and more particularly to an amplifier circuit and method which provides improved efficiency, for example an amplifier circuit comprising at least first and second amplifiers configured to operate in Chireix and Doherty modes of operation.

BACKGROUND

In radio base stations and other systems, power amplifiers are often used to amplify wideband signals or signal combinations with high peak to average power ratio (PAR or PAPR). The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

A Chireix amplifier (as described in "High power outphasing modulation," Proc. IRE, vol. 23, no. 11, pp. 1370-1392, November 1935, by H Chireix), or a Doherty amplifier (as described in "A new high efficiency power amplifier for modulated waves", by W. H. Doherty, Proc. IRE, vol. 24, no. 9, pp. 1163-1182, September 1936) were the first examples of amplifiers based on multiple transistors with passive output network interaction and combination.

They have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

The RF output current from the "peaking" sub-amplifier in the Doherty amplifier needs to rise linearly from zero at a "transition point" to full current at full amplitude. The "main" sub-amplifier has an entirely linear output current. The sum of the amplitudes of these currents deviates far from the ideal parabolic shape (of a constant efficiency amplifier), so the dip in efficiency in the upper amplitude region is quite substantial. Another way to intuitively get to the same result is to observe that the RF voltage at the peaking sub-amplifier is only medium high at the transition point, so the output current pulses will here experience large voltage drop across the transistor.

The Chireix amplifier has high efficiency in the upper amplitude region, since both sub-amplifier RF voltage amplitudes are high, and close in phase with the respective RF currents. Since variations in output amplitude are accompanied by phase shifts in the sub-amplifier RF voltages this operation mode is called "outphasing". In the outphasing region, the current pulses experience low voltage drop across the transistors. The RF current increase at the transition point is very gradual, and the overall shape of the sum of RF current amplitudes is much closer to the ideal parabolic shape than for the Doherty amplifier. The drawback of having both RF voltages high is that the efficiency of the amplifier is degraded by shunt loss, i.e. loss that behaves like a resistor coupled from the transistor output to ground (RF wise). With low loss transistors, Chireix outphasing is very efficient.

Earlier patent applications WO 2004/023647 and WO 2004/057755 by the present applicant describe an expandable multi-amplifier (having 3 sub-amplifiers and higher) structures containing one or more Chireix stages. Earlier patent application WO 2010/074615, also by the present applicant, describes a family of "Quasi-Chireix" amplifiers that have very high efficiency in both 3 and 4-stage (and higher) variants.

A paper by D. J. Perreault entitled "A new power combining and outphasing modulation system for high-efficiency power amplification", IEEE Proc. MWSCAS, 2010, pp. 441-444, describes hierarchic Chireix amplifiers that have higher efficiency than the 4-stage variants of WO 2004/023647 and WO 2010/074615 when very low loss transistors (specifically, low shunt loss) are employed. The amplifiers in the paper by Perreault only exist for 4, 8, 16 . . . etc. (powers of two) sub-amplifiers.

Earlier patent application WO 2013/087232, also by the present applicant as the present invention, describes asymmetric hierarchic Chireix amplifiers that can be used when other numbers of transistors are called for, such as 3, 5, 6, 7, 9 . . . etc. The "Chireix-Doherty" 3-stage amplifier of WO 2004/057755 has been improved for transistors with high shunt loss, and very much improved for having one transistor with very high loss, in co-pending application PCT/SE2013/050605 by the present applicant. The amplifier disclosed in co-pending application P42029 being filed con-currently herewith by the present applicant has the highest efficiency for moderate backoff levels.

The first Chireix-Doherty amplifiers of WO 2004/057755 and also the improved variant of co-pending application PCT/SE2013/050605 have a Chireix pair that is "outphasing" with very high efficiency in a middle amplitude region. In the upper amplitude region (its proportion determined by the size of the "peaking" sub-amplifier) they behave like the upper region in a Doherty amplifier, and are therefore sub-optimal when low shunt loss transistors are employed.

The amplifiers in WO 2010/074615 increased the proportion of outphasing behaviour, and exist in both 3-stage and 4-stage versions, but require different size sub-amplifiers and have slightly sub-optimal efficiency with very low-loss transistors.

The 4-stage amplifiers of Perreault are very close to optimal with very low-loss transistors, but do not exist for circuits having 3 sub-amplifier stages. The optimality also breaks down substantially if different size sub-amplifier pairs are employed.

The amplifiers in WO 2013/087232 exist in 3-stage versions with equal size sub-amplifiers, but have sub-optimal efficiency in a middle amplitude region when the lowermost transition point is placed at too low amplitude.

SUMMARY

It is an aim of the present invention to provide a method and apparatus which obviate or reduce at least one or more of the disadvantages mentioned above.

According to a first aspect of the present invention there is provided an amplifier circuit comprising a first amplifier configured to amplify a first input signal, wherein an output of the first amplifier is coupled to an output node via a first transmission line, the first transmission line comprising a first portion having a first characteristic impedance and a first length, and a second portion having a second characteristic impedance and a second length. The amplifier circuit comprises a second amplifier configured to amplify a second input signal, wherein an output of the second amplifier is coupled to the output node via a second transmission line, the second transmission line comprising a first portion having a first characteristic impedance and a first length, and a second portion having a second characteristic impedance and a second length. The amplifier circuit further comprises an auxiliary amplifier configured to amplify a third input signal, wherein an output of the auxiliary amplifier is coupled to an auxiliary transmission line network comprising: a first auxiliary transmission line coupled between an auxiliary junction and a first intersection between the first and second portions of the first transmission line; a second auxiliary transmission line coupled between the auxiliary junction and a second intersection between the first and second portions of the second transmission line; and a third auxiliary transmission line for coupling the output of the auxiliary amplifier to the auxiliary junction. For each of the first and second transmission lines the first and second portions consist of a higher-impedance portion and a lower-impedance portion whose lengths are substantially equal, and wherein the lengths of the respective first portions of the first and second transmission lines sum to half a wavelength, and the lengths of the respective second portions of the first and second transmission lines sum to half a wavelength.

According to another aspect of the present invention there is provided a method in an amplifier circuit. The method comprises the steps of amplifying a first input signal using a first amplifier, and coupling the amplified first input signal to an output node via a first transmission line, the first transmission line comprising a first portion having a first characteristic impedance and a first length, and a second portion having a second characteristic impedance and a second length. The method comprises the steps of amplifying a second input signal using a second amplifier, and coupling the amplified second input signal to the output node via a second transmission line, the second transmission line comprising a first portion having a first characteristic impedance and a first length, and a second portion having a second characteristic impedance and a second length. The method further comprises the steps of amplifying a third input signal using an auxiliary amplifier, and coupling the output of the auxiliary amplifier to an auxiliary transmission line network comprising: a first auxiliary transmission line coupled between an auxiliary junction and a first intersection between the first and second portions of the first transmission line; a second auxiliary transmission line coupled between the auxiliary junction and a second intersection between the first and second portions of the second transmission line; and a third auxiliary transmission line for coupling the output of the auxiliary amplifier to the auxiliary junction. For each of the first and second transmission lines the first and second portions consist of a higher-impedance portion and a lower-impedance portion whose lengths are substantially equal, and wherein the lengths of the respective first portions of the first and second transmission lines sum to half a wavelength, and the lengths of the respective second portions of the first and second transmission lines sum to half a wavelength.

BRIEF DESCRIPTION OF THE DRAWINGS

For a better understanding of examples of the present invention, and to show more clearly how the examples may be carried into effect, reference will now be made, by way of example only, to the following drawings in which:

FIGS. 2b to 2f show associated RF currents, voltages and efficiency curves relating to the embodiment of FIG. 2a;

FIGS. 3b to 3f show associated RF currents, voltages and efficiency curves relating to the embodiment of FIG. 3a;

FIGS. 4b to 4f show associated RF currents, voltages and efficiency curves relating to the embodiment of FIG. 4a;

FIGS. 5b to 5f show associated RF currents, voltages and efficiency curves relating to the embodiment of FIG. 5a;

FIGS. 6b to 6f show associated RF currents, voltages and efficiency curves relating to the embodiment of FIG. 6a.

DETAILED DESCRIPTION

The amplifier circuit of co-pending application P42029 being filed concurrently herewith has in its 3-stage version the highest efficiency for instantaneous backoff levels down to −9.5 dB, but can lose much of its good properties when dimensioned for other cases.

Therefore, embodiments of the present invention are aimed at providing 3-stage amplifiers that have increased efficiency in the amplitude region above the lower outphasing region, together with the ability of dimensioning for high PAR values. Other embodiments of the present invention are aimed at providing 4-stage amplifiers with these properties and good efficiency also when different size sub-amplifier pairs are employed.

Figure 1:
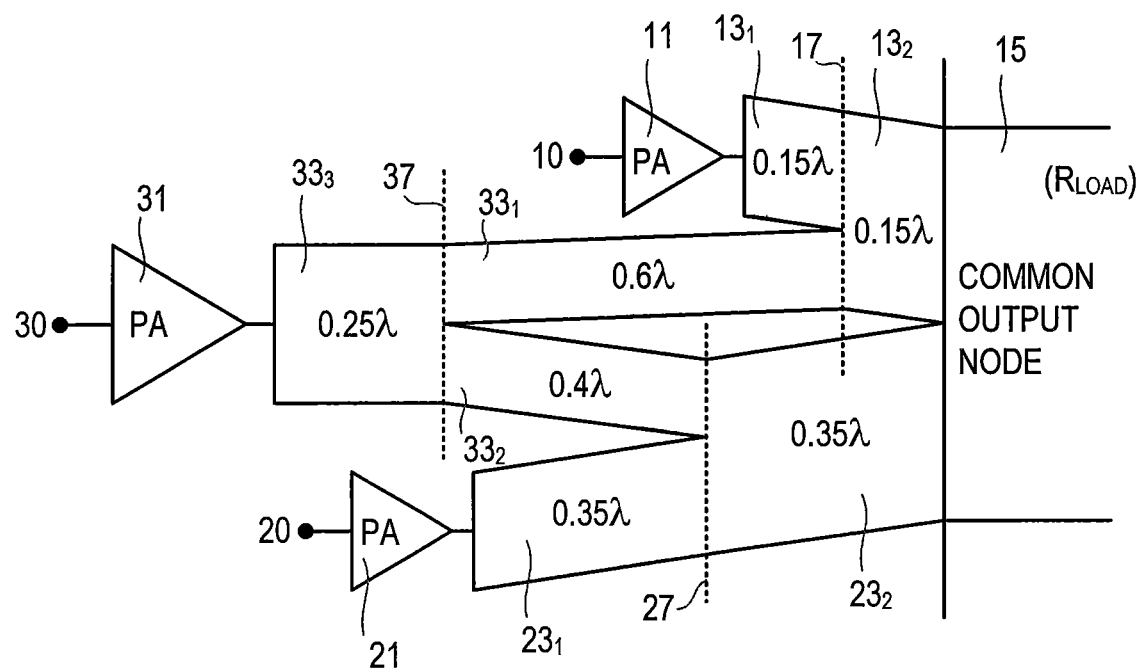
FIG. 1 shows an amplifier circuit according to a first embodiment of the present invention.

FIG. 1 shows an amplifier circuit according to an embodiment of the invention. The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peaking amplifier) configured to amplify a third input signal 30. An output of the auxiliary amplifier 31 is coupled to an auxiliary transmission line network 33. The auxiliary transmission line network 33 comprises: a first auxiliary transmission line $33_1$ coupled between an auxiliary junction 37 and a first intersection 17 between the first and second portions $13_1$, $13_2$ of the first transmission line 13; a second auxiliary transmission line $33_2$ coupled between the auxiliary junction 37 and a second intersection 27 between the first and second portions $23_1$, $23_2$ of the second transmission line 23; and a third auxiliary transmission line $33_3$ for coupling the output of the auxiliary amplifier 31 to the auxiliary junction 37. The third auxiliary transmission line $33_3$ comprises, for example, a quarter wavelength transmission line for coupling the output of the auxiliary amplifier 31 to the auxiliary junction 37.

For each of the first and second transmission lines 13, 23, the first and second portions consist of a higher-impedance portion and a lower-impedance portion whose lengths are substantially equal.

For example, in the example of FIG. 1, the first transmission line 13 comprises a first portion $13_1$ having an electrical length of $0.15\lambda$, and a second portion $13_2$ having an electrical length of $0.15\lambda$, which are substantially equal, with the first portion $13_1$ having a higher impedance than the second portion $13_2$ as illustrated by the different thicknesses of the respective portions, (the smaller the thickness the higher the characteristic impedance, and vice versa, which also applies to other embodiments of the invention as described herein).

Furthermore, the lengths of the respective first portions $13_1$, $23_1$ of the first and second transmission lines 13, 23 sum to half a wavelength, while the lengths of the respective second portions $13_2$, $23_2$ of the first and second transmission lines 13, 23 also sum to half a wavelength.

For example, in the example of FIG. 1 the lengths of the respective first portions $13_1$, $23_1$ of the first and second transmission lines 13, 23, i.e. $0.15\lambda$ and of $0.35\lambda$ sum to half a wavelength (i.e. $0.5\lambda$), while the lengths of the respective second portions $13_2$, $23_2$ of the first and second transmission lines 13, 23 also sum to half a wavelength, i.e. the sum of $0.15\lambda$ and $0.35\lambda$.

From the example of FIG. 1 is can be seen that the auxiliary amplifier 31 is coupled by a quarter wavelength line to the auxiliary junction 37 from which it branches (via first and second auxiliary transmission lines $33_1$ and $33_2$) to the Chireix pair midpoint junctions (i.e. first and second intersections 17, 27). The length of each of the first and second auxiliary transmission lines $33_1$ and $33_2$ is three quarters of a wavelength minus the length of the second portion of the respective transmission lines which connects the auxiliary transmission line to the output (i.e. the transmission line from the midpoint to the output).

As such, the total length from the auxiliary junction 37 to the output 15 through any path is equal to three quarter wavelengths.

Also, since the auxiliary amplifier 31 is coupled to the auxiliary junction 37 via a quarter wavelength, the total length from the output of the auxiliary amplifier 31 to the output 15 through both its paths is equal to one wavelength.

In the example of FIG. 1 the auxiliary transmission line $33_1$ is therefore $0.6\lambda$ (i.e. $0.75\lambda$ minus the length $0.15\lambda$ of the second portion $13_2$ of the first transmission line 13). Likewise, the auxiliary transmission line $33_2$ is therefore $0.4\lambda$ (i.e. $0.75\lambda$ minus the length $0.35\lambda$ of the second portion $23_2$ of the second transmission line 23).

Figure 2A:
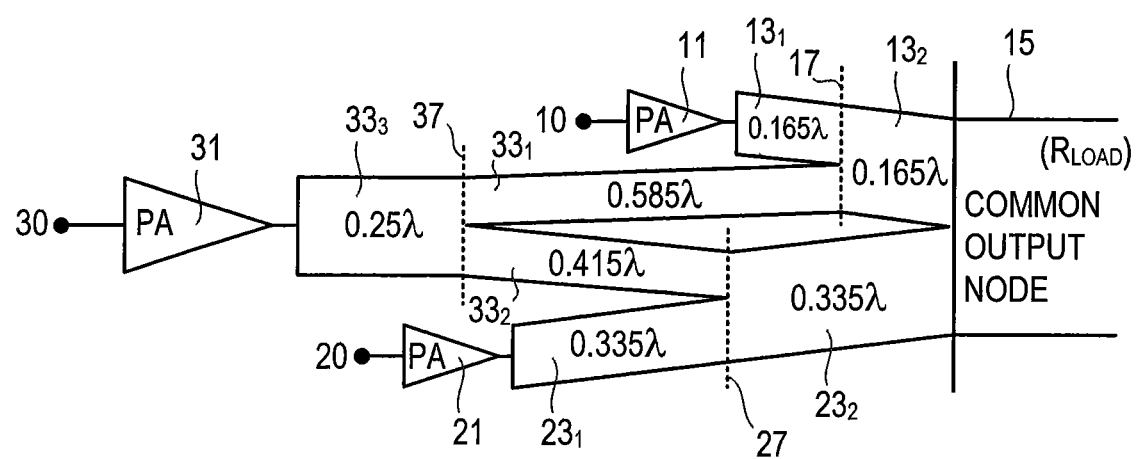
FIG. 2a shows an amplifier circuit according to another embodiment of the present invention.

FIG. 2a shows an amplifier circuit according to another embodiment of the invention. The amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peak amplifier) configured to amplify a third input signal 30. An output of the auxiliary amplifier 31 is coupled, to an auxiliary transmission line network 33. The auxiliary transmission line network 33 comprises: a first auxiliary transmission line $33_1$ coupled between an auxiliary junction 37 and a first intersection 17 between the first and second portions $13_1$, $13_2$ of the first transmission line 13; a second auxiliary transmission line $33_2$ coupled between the auxiliary junction 37 and a second intersection 27 between the first and second portions $23_1$, $23_2$ of the second transmission line; and a third auxiliary transmission line $33_3$ for coupling the output of the auxiliary amplifier 31 to the auxiliary junction 37. The third auxiliary transmission line $33_3$ comprises, for example, a quarter wavelength transmission line for coupling the output of the auxiliary amplifier 31 to the auxiliary junction 37.

For each of the first and second transmission lines 13, 23, the first and second portions consist of a higher-impedance portion and a lower-impedance portion whose lengths are substantially equal.

For example, in the example of FIG. 2a, the first transmission line 13 comprises a first portion $13_1$ having an electrical length of $0.165\lambda$, and a second portion $13_2$ having an electrical length of $0.165\lambda$, which are substantially equal, with the first portion $13_1$ having a higher impedance than the second portion $13_2$ (as illustrated by the different thicknesses of the portions).

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

For example, in the example of FIG. 2a the lengths of the respective first portions $13_1$, $23_1$ of the first and second transmission lines 13, 23, i.e. $0.165\lambda$ and $0.335\lambda$ sum to half a wavelength, while the lengths of the respective second portions $13_2$, $23_2$ of the first and second transmission lines 13, 23 also sum to half a wavelength, i.e. the sum of $0.165\lambda$ and $0.335\lambda$.

From the example of FIG. 2a is can be seen that the auxiliary amplifier 31 is coupled by a quarter wavelength line to the auxiliary junction 37 from which it branches (via first and second auxiliary transmission lines $33_1$ and $33_2$) to the Chireix pair midpoint junctions (i.e. the first and second intersections 17, 27). The length of each of the first and second auxiliary transmission lines $33_1$ and $33_2$ is three quarters of a wavelength minus the length of the second portion of the respective transmission lines which connects the auxiliary transmission line to the output (i.e. the transmission line from the midpoint to the output).

As such, the total length from the auxiliary amplifier to the output 15 through any path is equal to three quarter wavelengths.

In the example of FIG. 2a the auxiliary transmission line $33_1$ is therefore 0.585λ (i.e. 0.75λ minus the length 0.165λ of the second portion $13_2$ of the first transmission line 13). Likewise, the auxiliary transmission line $33_2$ is therefore 0.415λ (i.e. 0.75λ minus the length 0.335λ of the second portion $23_2$ of the second transmission line 23).

FIGS. 2b to 2f show associated RF currents, voltages and efficiency curves relating to the embodiment of FIG. 2a.

In this example, the auxiliary amplifier 31 is selected to be able to output more current, for example about 60% more current, i.e. its size is about 60% larger, than that of the individual Chireix pair sub-amplifiers (i.e. the first and second amplifiers 11, 21). The transmission line impedance from the auxiliary amplifier 31 is therefore lowered accordingly (for example by a ratio of 1/1.6 in this example) for an equal peak RF voltage swing.

It is noted that when the size of an amplifier is mentioned herein, the impedances of the transmission line or lines from that sub-amplifier are assumed to follow this rule.

For example, an impedance of the third auxiliary transmission line $33_3$ is decreased relative to the impedance of a transmission lines $13_1$, $23_1$ connected to the first or second amplifiers 11, 21, by an amount proportional to the increase in the size of the auxiliary amplifier 31 (as illustrated in FIG. 2a by the increased thickness of the third auxiliary transmission line $33_3$ compared to that of the portions $13_1$, $23_1$ of the first and second transmission lines 13, 23).

It can be seen from the graphs that there are two outphasing regions according to this embodiment; one in the amplitude range 0.2-0.4, when only the first and second amplifiers 11, 21 are active (i.e. the Chireix pair is active), and one in the range above 0.4, where the auxiliary amplifier 31 also delivers current. This upper region extends all the way up to full amplitude, and has efficiency comparable to a Chireix amplifier, i.e. significantly higher than the corresponding region in the amplifier shown in WO 2004/057755. It is noted that in FIG. 2d the curve labelled $11_1$ is the efficiency curve in a scale of 0 to 1, while the curve $11_2$ is the same efficiency curve but magnified to help illustrate its characteristics.

Changing the location of the efficiency peaks has a lower penalty than for the amplifier circuit of co-pending application P42029 being filed concurrently with this application. This is done both by changing the electrical length parameter (for the six electrical lengths that are not quarter wavelengths, i.e. the first and second portions $13_1$ and $13_2$ of the first transmission line 13, the first and second portions $23_1$ and $23_2$ of the second transmission line 23, and the first and second auxiliary transmission lines $33_1$ and $33_2$ of the auxiliary transmission line network 33) and by changing the size of the auxiliary amplifier 31 relative to that of the first and second amplifiers 11, 21 (i.e. the Chireix pair sub-amplifiers).

Figure 3A:
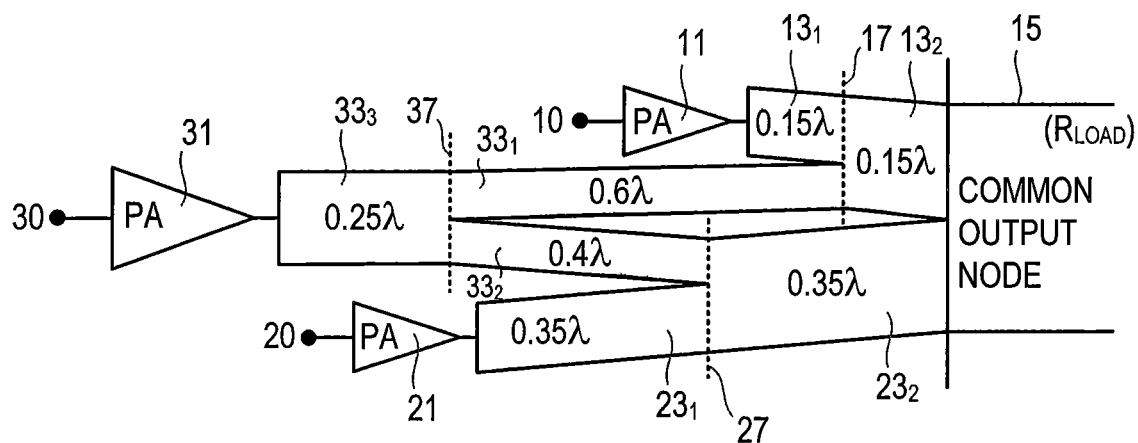
FIG. 3a shows an amplifier circuit according to another embodiment of the present invention.

FIG. 3a shows an example of such an embodiment, whereby the length parameter is decreased to 0.15, and the relative size of the auxiliary amplifier 31 is decreased to 1.3 times the size of the first and second amplifiers 11, 21.

This embodiment has the advantage of reducing the droop in efficiency in the upper outphasing region and shifting the lower outphasing region to a higher amplitude.

Thus, the amplifier circuit according to the example of FIG. 3a comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

The amplifier circuit also comprises an auxiliary amplifier 31 (also referred to herein as a peak amplifier) configured to amplify a third input signal 30. An output of the auxiliary amplifier 31 is coupled to an auxiliary transmission line network 33. The auxiliary transmission line network 33 comprises: a first auxiliary transmission line $33_1$ coupled between an auxiliary junction 37 and a first intersection 17 between the first and second portions $13_1$, $13_2$ of the first transmission line 13; a second auxiliary transmission line $33_2$ coupled between the auxiliary junction 37 and a second intersection 27 between the first and second portions $23_1$, $23_2$ of the second transmission line; and a third auxiliary transmission line $33_3$ for coupling the output of the auxiliary amplifier 31 to the auxiliary junction 37. The third auxiliary transmission line $33_3$ comprises, for example, a quarter wavelength transmission line for coupling the output of the auxiliary amplifier 31 to the auxiliary junction 37.

For each of the first and second transmission lines 13, 23, the first and second portions consist of a higher-impedance portion and a lower-impedance portion whose lengths are substantially equal.

For example, in the example of FIG. 3a, the first transmission line 13 comprises a first portion $13_1$ having an electrical length of 0.15λ (i.e. decreased from 0.165λ compared to the embodiment of FIG. 2a), and a second portion $13_2$ having an electrical length of 0.15λ (also decreased from 0.165λ compared to the embodiment of FIG. 2a). These lengths are substantially equal, with the first portion $13_1$ having a higher impedance than the second portion $13_2$ (as illustrated by the different thicknesses of the portions).

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

Therefore, in the example of FIG. 3a the lengths of the respective first portions $13_1$, $23_1$ of the first and second transmission lines 13, 23, i.e. 0.15λ and 0.35λ sum to half a wavelength, while the lengths of the respective second portions $13_2$, $23_2$ of the first and second transmission lines 13, 23 also sum to half a wavelength, i.e. the sum of 0.15λ and 0.35λ.

From the example of FIG. 3a is can be seen that the auxiliary amplifier 31 is coupled by a quarter wavelength line 33₃ (i.e. 0.25λ) to the auxiliary junction 37 from which the auxiliary transmission line network 33 branches (via first and second auxiliary transmission lines 33₁ and 33₂) to the Chireix pair midpoint junctions, 17, 27. The length of each of the first and second auxiliary transmission lines 33₁ and 33₂ is three quarters of a wavelength minus the length of the second portion of the respective transmission lines which connects the auxiliary transmission line to the output (i.e. the transmission line from the midpoint to the output).

As such, the total length from the auxiliary junction 37 to the output 15 through any path is equal to three quarter wavelengths.

In the example of FIG. 3a the auxiliary transmission line 33₁ is therefore 0.6λ (i.e. 0.75λ minus the length 0.15λ of the second portion 13₂ of the first transmission line 13). Likewise, the auxiliary transmission line 33₂ is therefore 0.4λ (i.e. 0.75λ minus the length 0.35λ of the second portion 23₂ of the second transmission line 23).

Also, the total length from the output of the auxiliary amplifier 31 to the output 15 through any path is equal to one wavelength.

FIGS. 3b to 3f show associated RF currents, voltages and efficiency curves relating to the embodiment of FIG. 3a. As above, it is noted that in FIG. 3d the curve labelled 11₁ is the efficiency curve in a scale of 0 to 1, while the curve 11₂ is the same efficiency curve but magnified to help illustrate its characteristics.

As mentioned above, this embodiment has the advantage of reducing the droop in efficiency in the upper outphasing region and shifting the lower outphasing region to a higher amplitude.

It is noted that slight asymmetries can be tolerated, and sometimes it is also advantageous to design away from the fixed equal length and half-lambda relationships. In the example according to the embodiment of FIG. 4a, such shifts have been applied to the example of FIG. 2a, which results in a higher efficiency around the middle efficiency peak at the cost of slightly lower efficiency for the lowest efficiency peak.

Figure 4A:
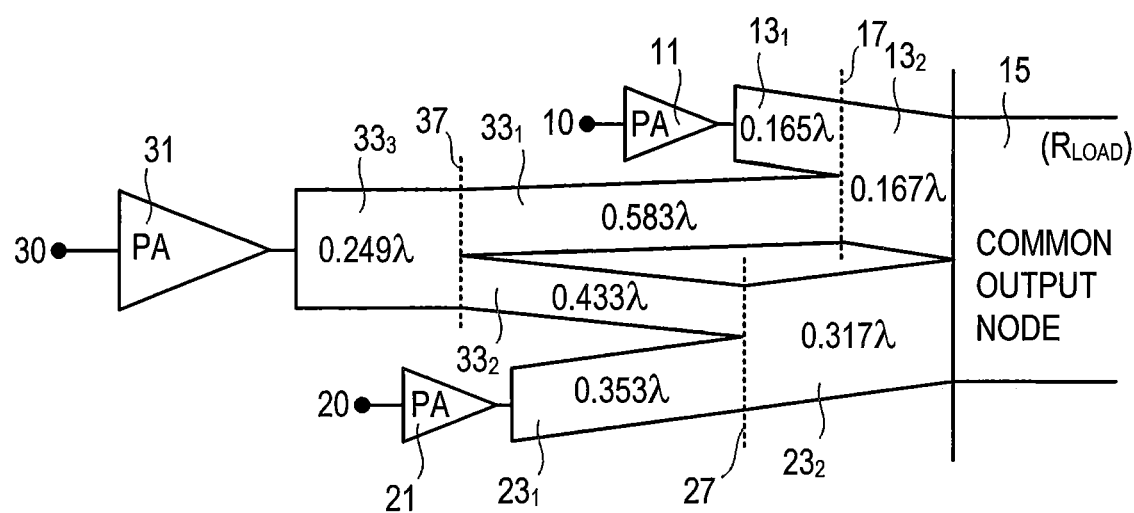
FIG. 4a shows an amplifier circuit according to another embodiment of the present invention.

Referring to FIG. 4a, the amplifier circuit according to the example of FIG. 4a comprises a first amplifier 11 configured to amplify a first input signal 10. An output of the first amplifier 11 is coupled to an output node 15 via a first transmission line 13. The first transmission line 13 comprises a first portion 13₁ having a first characteristic impedance and a first length, and a second portion 13₂ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion 23₁ having a first characteristic impedance and a first length, and a second portion 23₂ having a second characteristic impedance and a second length.

The amplifier circuit also comprises an auxiliary amplifier 31 (also referred to herein as a peak amplifier) configured to amplify a third input signal 30. An output of the auxiliary amplifier 31 is coupled to an auxiliary transmission line network 33. The auxiliary transmission line network 33 comprises: a first auxiliary transmission line 33₁ coupled between an auxiliary junction 37 and a first intersection 17 between the first and second portions 13₁, 13₂ of the first transmission line 13; a second auxiliary transmission line 33₂ coupled between the auxiliary junction 37 and a second intersection 27 between the first and second portions 23₁, 23₂ of the second transmission line; and a third auxiliary transmission line 33₃ for coupling the output of the auxiliary amplifier 31 to the auxiliary junction 37. The third auxiliary transmission line 33₃ comprises, for example, a quarter wavelength transmission line for coupling the output of the auxiliary amplifier 31 to the auxiliary junction 37.

For each of the first and second transmission lines 13, 23, the first and second portions consist of a higher-impedance portion and a lower-impedance portion whose lengths are substantially equal.

For example, in the example of FIG. 4a, the first transmission line 13 comprises a first portion 13₁ having an electrical length of 0.165λ, and a second portion 13₂ having an electrical length of 0.167λ (compared to 0.165λ in the embodiment of FIG. 2a). As such, a slight asymmetry has been introduced to the second portion 13₂ of the first transmission line 13, such that the lengths are no longer exactly equal, but still substantially equal. As with FIG. 2a, the first portion 13₁ has a higher impedance than the second portion 13₂ (as illustrated by the different thicknesses of the portions).

Likewise, in the example of FIG. 4a, the second transmission line 23 comprises a first portion 23₁ having an electrical length of 0.353λ (i.e. compared to 0.335λ in the embodiment of FIG. 2a), and a second portion 23₂ having an electrical length of 0.317λ (compared to 0.335λ in the embodiment of FIG. 2a). As such, a slight asymmetry has been introduced to the first and second portions 23₁, 23₂ of the second transmission line 23, such that the lengths are no longer exactly equal, but still substantially equal. As with FIG. 2a, the first portion 13₁ has a higher impedance than the second portion 13₂ (as illustrated by the different thicknesses of the portions).

Thus, in the example of FIG. 4a the lengths of the respective first portions 13₁, 23₁ of the first and second transmission lines 13, 23, are 0.165λ and 0.353λ respectively. It can therefore be seen that the slight asymmetry that has been introduced no longer results in a sum corresponding to exactly half a wavelength, but still substantially half a wavelength. Likewise, the lengths of the respective second portions 13₂, 23₂ of the first and second transmission lines 13, 23, being 0.167λ and 0.317λ no longer results in a sum corresponding to exactly half a wavelength, but still substantially half a wavelength.

As such, the lengths of the respective first portions 13₁, 23₁ of the first and second transmission lines 13, 23 no longer sum to exactly half a wavelength, but still sum to substantially half a wavelength, while the lengths of the respective second portions 13₂, 23₂ of the first and second transmission lines 13, 23 no longer sum to exactly half a wavelength, but still sum to substantially half a wavelength.

From the example of FIG. 4a is can be seen that the auxiliary amplifier 31 is coupled by a quarter wavelength line 33₃ which also has a slight asymmetry (i.e. 0.249λ rather than 0.25λ) to the auxiliary junction 37 from which the auxiliary transmission line network 33 branches (via first and second auxiliary transmission lines 33₁ and 33₂) to the Chireix pair midpoint junctions. The length of each of the first and second auxiliary transmission lines 33₁ and 33₂ is three quarters of a wavelength minus the length of the second portion of the respective transmission lines which connects the auxiliary transmission line to the output (i.e. the transmission line from the midpoint to the output).

As such, the total length from the auxiliary junction 37 to the output 15 through any path is still equal to three quarter wavelengths in this embodiment.

In the example of FIG. 4a the auxiliary transmission line 33₁ is therefore 0.583λ (i.e. 0.75λ minus the length 0.167λ of the second portion $13_2$ of the first transmission line 13). Likewise, the auxiliary transmission line $33_2$ is therefore 0.433λ (i.e. 0.75λ minus the length 0.317λ of the second portion $23_2$ of the second transmission line 23).

However, because of the slight asymmetry to the quarter wavelength line $33_3$, the total length from the output of the auxiliary amplifier 31 to the output 15 through any path is not exactly equal to one wavelength (but 0.99λ in each path), thus still being substantially equal to one wavelength.

FIGS. 4b to 4f show associated RF currents, voltages and efficiency curves relating to the embodiment of FIG. 4a. It is noted that in FIG. 4d the curve labelled $11_1$ is the efficiency curve in a scale of 0 to 1, while the curve $11_2$ is the same efficiency curve but magnified to help illustrate its characteristics.

Next, some examples will be described for increasing the amplifier circuit from a 3-stage amplifier circuit to a 4-stage amplifier circuit.

According to one embodiment the auxiliary amplifier 31 is replaced with a Chireix pair, and results in an efficient 4-stage amplifier. The addition of the fourth stage makes it possible to extend the region of high efficiency to lower amplitudes, which increases the efficiency for high PAR signals, or to increase the efficiency in the high-efficiency region, which increases the efficiency for medium PAR signals, or combinations thereof.

Figure 5A:
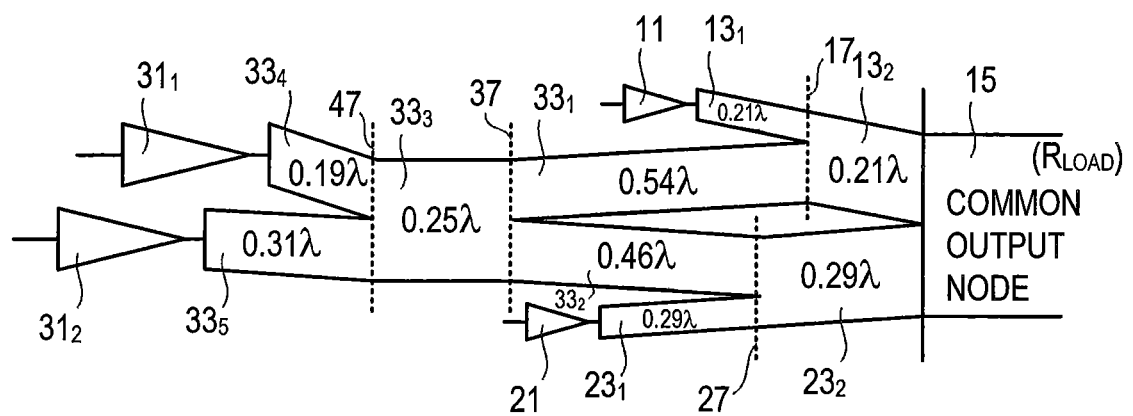
FIG. 5a shows an amplifier circuit according to another embodiment of the present invention.
Figure 5B:
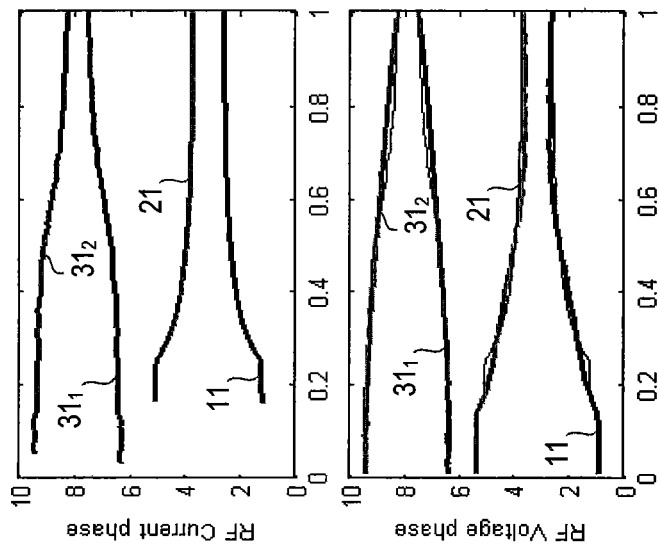
Figure 5C:
Figure 5D:
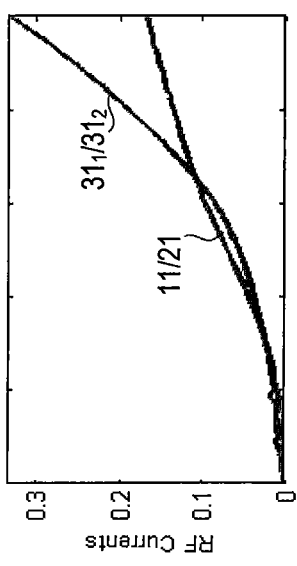
Figure 5E:
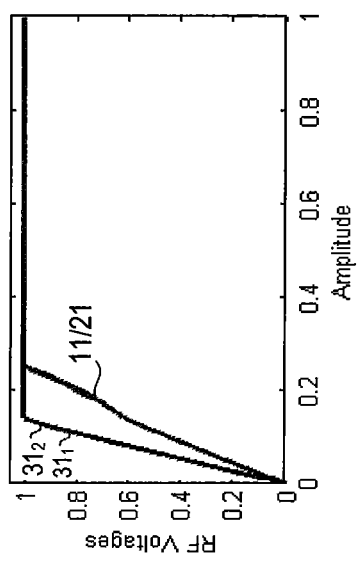
Figure 5F:
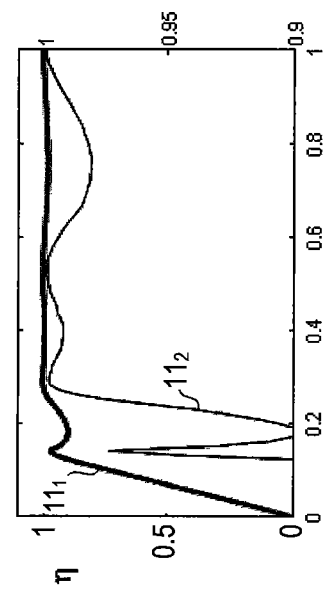

Referring to the embodiment of FIG. 5a and its related graphs in FIGS. 5b to 5f, the characteristics can be seem for a version of this type of amplifier when using sub-amplifier pairs with a 2-to-1 size relation, designed primarily for high efficiency in the middle amplitude region.

Thus, in the example of FIG. 5a, the auxiliary amplifier 31 comprises first and second auxiliary amplifiers $31_1$, $31_2$, and wherein the first auxiliary amplifier $31_1$ is coupled via a fourth auxiliary transmission line $33_4$ to the third auxiliary transmission line $33_3$ (the quarter wavelength transmission line), and the second auxiliary amplifier $31_2$ coupled via a fifth auxiliary transmission line $33_5$ to the third auxiliary transmission line $33_3$ (the quarter wavelength transmission line). The third auxiliary transmission line $33_3$ is coupled the auxiliary junction 37. The length of the fourth auxiliary transmission line $33_4$ and fifth auxiliary transmission line $33_5$ sum to half a wavelength. For example, in the embodiment of FIG. 5a the length of the fourth auxiliary transmission line $33_4$ is 0.19λ and the length of the fifth auxiliary transmission line $33_5$ is 0.31λ, thereby summing to 0.5λ.

The auxiliary transmission line network 33 also comprises first and second auxiliary transmission lines $33_1$ and $33_2$ for coupling the third auxiliary transmission line $33_3$ (the quarter wavelength transmission line) via the auxiliary junction 37 to the first and second intersections of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 5a the first auxiliary transmission line $33_1$ is therefore 0.54λ (i.e. 0.75λ minus the length 0.21λ of the second portion $13_2$ of the first transmission line 13). Likewise, the second auxiliary transmission line $33_2$ is therefore 0.46λ (i.e. 0.75λ minus the length 0.29λ of the second portion $23_2$ of the second transmission line 23).

In the example of FIG. 5a first amplifier 11 and second amplifier 21 have a 1-to-2 size relationship with the first auxiliary amplifier $31_1$ and second auxiliary amplifier $31_2$. The first amplifier 11 and second amplifier 21 are of substantially the same size, and wherein the first auxiliary amplifier $31_1$ and second auxiliary amplifier $31_2$ are of substantially the same size but larger than the first and second amplifiers 11, 21, e.g. 50% larger. In such an example, the first and second amplifiers 11, 21 are about 50% of the size of the first auxiliary amplifier $31_1$ and second auxiliary amplifier $31_2$.

As with the earlier embodiment of FIG. 2a, in the example of FIG. 5a the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a first length, and a second portion $23_2$ having a second characteristic impedance and a second length.

For each of the first and second transmission lines 13, 23, the first and second portions consist of a higher-impedance portion and a lower-impedance portion whose lengths are substantially equal.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 5a, the first transmission line 13 comprises a first portion $13_1$ having an electrical length of 0.21λ, and a second portion $13_2$ having an electrical length of 0.21λ, such that the electrical lengths are substantially equal. Similarly, in the example of FIG. 5a, the second transmission line 23 comprises a first portion $23_1$ having an electrical length of 0.29λ, and a second portion $23_2$ having an electrical length of 0.29λ, such that the electrical lengths are substantially equal.

Also in the example of FIG. 5a the lengths of the respective first portions $13_1$, $23_1$ of the first and second transmission lines 13, 23, i.e. 0.21λ for the first portion $13_1$ and 0.29λ for the first portion $23_1$ sum to half a wavelength, while the lengths of the respective second portions $13_2$, $23_2$ of the first and second transmission lines 13, 23 also sum to half a wavelength, i.e. the sum of 0.21λ and 0.29λ.

FIGS. 5b to 5f show associated RF currents, voltages and efficiency curves relating to the embodiment of FIG. 5a. It is noted that in FIG. 5d the curve labelled $11_1$ is the efficiency curve in a scale of 0 to 1, while the curve $11_2$ is the same efficiency curve but magnified to help illustrate its characteristics.

Figure 6A:
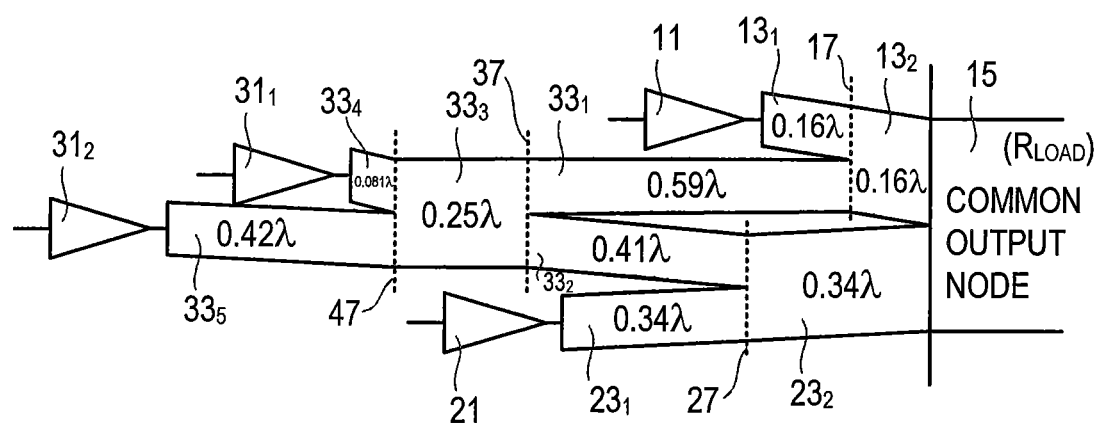
FIG. 6a shows an amplifier circuit according to another embodiment of the present invention.

FIG. 6a shows an example of another embodiment of 4-stage dimensioning, similar to that of FIG. 5a, but whereby all sub-amplifiers have the same size. In such an example the first amplifier 11, second amplifier 21, first auxiliary amplifier $31_1$ and second auxiliary amplifier $31_2$ are of substantially the same size.

In the example of FIG. 6a, the auxiliary amplifier 31 of FIG. 2a is replaced with first and second auxiliary amplifiers $31_1$, $31_2$, and wherein the first auxiliary amplifier $31_1$ is coupled via a fourth auxiliary transmission line $33_4$ to the third auxiliary transmission line $33_3$ (the quarter wavelength transmission line), and the second auxiliary amplifier $31_2$ coupled via a fifth auxiliary transmission line $33_5$ to the third auxiliary transmission line $33_3$ (the quarter wavelength transmission line). The third auxiliary transmission line $33_3$ is coupled the auxiliary junction 37. The length of the fourth auxiliary transmission line $33_4$ and fifth auxiliary transmission line $33_5$ sum to substantially half a wavelength. In the example of FIG. 5a the length of the fourth auxiliary transmission line $33_4$ is $0.081\lambda$ and the length of the fifth auxiliary transmission line $33_5$ is $0.42\lambda$.

The auxiliary transmission line network 33 also comprises first and second auxiliary transmission lines $33_1$ and $33_2$ for coupling the third auxiliary transmission line $33_3$ (the quarter wavelength transmission line) via the auxiliary junction 37 to the first and second intersections of the first and second transmission lines 13, 23. The length of each of the first and second auxiliary transmission lines $33_1$, $33_2$ is three quarters of a wavelength minus the length of the second portion $13_2$, $23_2$ of the respective transmission line which connects the auxiliary transmission line to the output.

In the example of FIG. 6a the first auxiliary transmission line $33_1$ is therefore $0.59\lambda$ (i.e. $0.75\lambda$ minus the length $0.16\lambda$ of the second portion $13_2$ of the first transmission line 13). Likewise, the second auxiliary transmission line $33_2$ is therefore $0.41\lambda$ (i.e. $0.75\lambda$ minus the length $0.34\lambda$ of the second portion $23_2$ of the second transmission line 23).

In the example of FIG. 6a first amplifier 11, second amplifier 21, the first auxiliary amplifier $31_1$ and second auxiliary amplifier $31_2$ are all of substantially equal size.

As with the earlier embodiments of FIGS. 2a and 5a, in the example of FIG. 6a the amplifier circuit comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a first length, and a second portion $13_2$ having a second characteristic impedance and a second length.

The amplifier circuit also comprises a second amplifier 21 configured to amplify a second input signal 20. An output of the second amplifier 21 is coupled to the output node 15 via a second transmission line 23. The second transmission line 23 comprises, a first portion $23_1$ having a first characteristic impedance and a first length, and a second portion $23_2$ having a second characteristic impedance and a second length.

For each of the first and second transmission lines 13, 23, the first and second portions consist of a higher-impedance portion and a lower-impedance portion whose lengths are substantially equal.

Furthermore, the lengths of the respective first portions $13_1$, $23_1$ of the first and second transmission lines 13, 23 also sum to half a wavelength, while the lengths of the respective second portions $13_2$, $23_2$ of the first and second transmission lines 13, 23 also sum to half a wavelength.

In the example of FIG. 6a, the first transmission line 13 comprises a first portion $13_1$ having an electrical length of $0.16\lambda$, and a second portion $13_2$ having an electrical length of $0.16\lambda$, such that the electrical lengths are substantially equal. Similarly, in the example of FIG. 6a, the second transmission line 23 comprises a first portion $23_1$ having an electrical length of $0.34\lambda$, and a second portion $23_2$ having an electrical length of $0.34\lambda$, such that the electrical lengths are substantially equal.

Also in the example of FIG. 6a the lengths of the respective first portions $13_1$, $23_1$ of the first and second transmission lines 13, 23, i.e. $0.16\lambda$ for the first portion $13_1$ and $0.34\lambda$ for the first portion $23_1$ sum to half a wavelength, while the lengths of the respective second portions $13_2$, $23_2$ of the first and second transmission lines 13, 23 also sum to half a wavelength, i.e. the sum of $0.16\lambda$ and $0.34\lambda$.

FIGS. 6b to 6f show associated RF currents, voltages and efficiency curves relating to the embodiment of FIG. 6a. It is noted that in FIG. 6d the curve labelled $11_1$ is the efficiency curve in a scale of 0 to 1, while the curve $11_2$ is the same efficiency curve but magnified to help illustrate its characteristics.

It is noted that other possible embodiments, in addition to those described above, include connecting a sub-amplifier directly (or connected by a half wavelength line) at the output, which gives a Doherty-like upper amplitude range. In such an arrangement the 3-stage amplifier embodiments described above further comprise a fourth amplifier configured to amplify a fourth input signal, wherein an output of the fourth amplifier is coupled either directly to the output node, or via a half wavelength transmission line or multiple thereof. The third amplifier (auxiliary amplifier 31) may also be replaced with a Chireix-Doherty structure to provide a five-stage amplifier. Substituting the same three-stage structure for the third sub-amplifier (auxiliary amplifier) to yield a five-stage amplifier is also possible.

Figure 7:
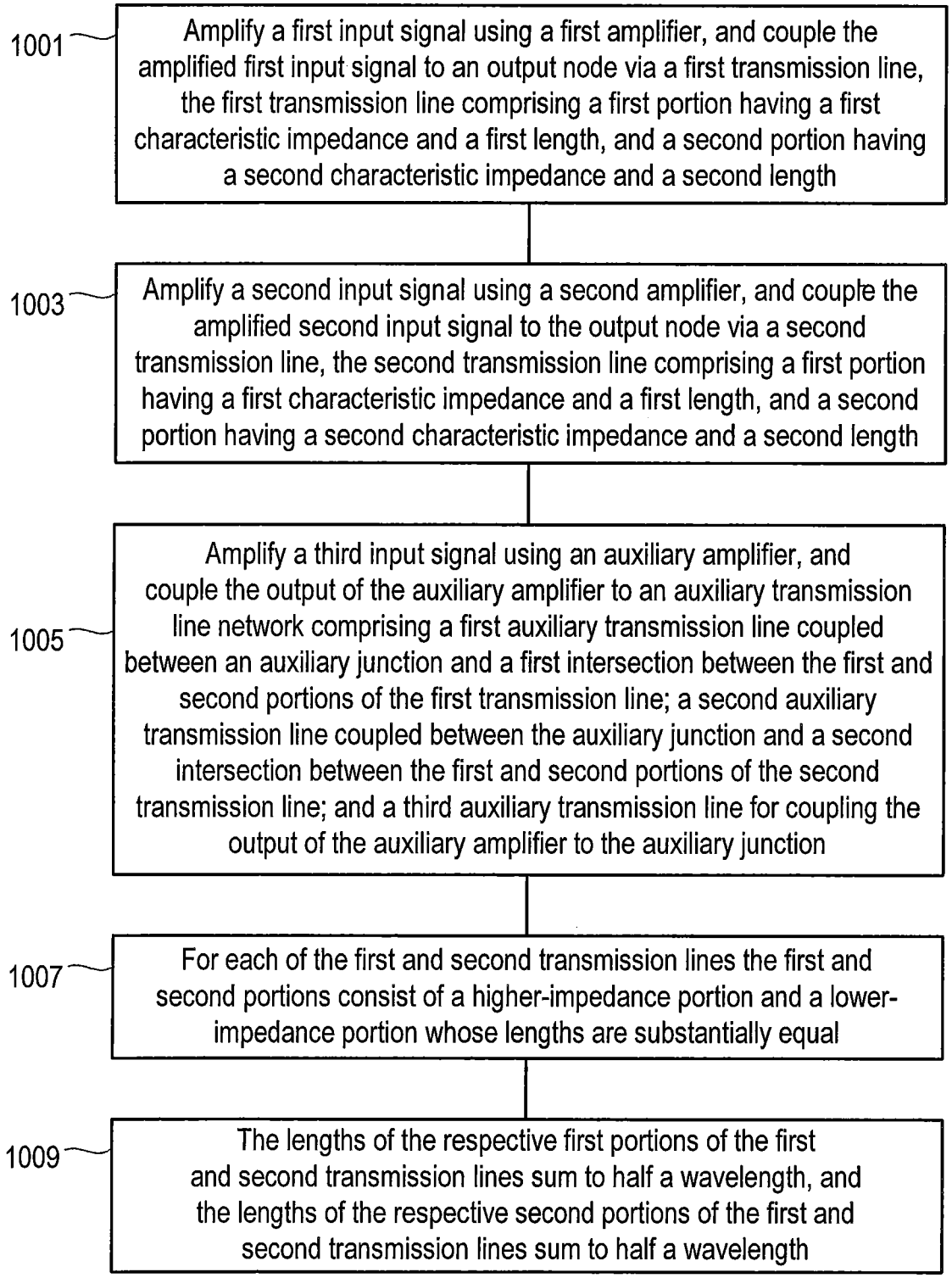
FIG. 7 shows the steps performed by a method according to an embodiment of the present invention.

FIG. 7 describes the steps of a method in an amplifier circuit according to an embodiment of the invention. The method comprises the steps of amplifying a first input signal using a first amplifier, and coupling the amplified first input signal to an output node via a first transmission line, the first transmission line comprising a first portion having a first characteristic impedance and a first length, and a second portion having a second characteristic impedance and a second length, step 1001. The method also comprises the step of amplifying a second input signal 20 using a second amplifier, and coupling the amplified second input signal to the output node via a second transmission line, the second transmission line comprising a first portion having a first characteristic impedance and a first length, and a second portion having a second characteristic impedance and a second length, step 1003. The method further comprises the step of amplifying a third input signal 30 using an auxiliary amplifier, and coupling the output of the auxiliary amplifier to an auxiliary transmission line network comprising: a first auxiliary transmission line coupled between an auxiliary junction and a first intersection between the first and second portions of the first transmission line; a second auxiliary transmission line coupled between the auxiliary junction and a second intersection between the first and second portions of the second transmission line; and a third auxiliary transmission line for coupling the output of the auxiliary amplifier to the auxiliary junction, step 1005. For each of the first and second transmission lines the first and second portions consist of a higher-impedance portion and a lower-impedance portion whose lengths are substantially equal, step 1007. The lengths of the respective first portions of the first and second transmission lines sum to half a wavelength, and the lengths of the respective second portions of the first and second transmission lines sum to half a wavelength, step 1009.

Transistors in general act as controlled RF current sources, so the shape of the amplitudes and phases (relative to that of the output) of the RF currents as functions of the output amplitude also suggest the desired voltage shaping that can be performed to the input signals (gate drive voltages). The actual shapes can take into account that the voltage-to-current conversion (transconductance) in the transistors is more or less nonlinear, and that the RF voltage swing can influence the output current as well (especially via saturation when close to the upper limit).

It is noted that for all the transmission lines shown in the example embodiments above, these can be replaced by equivalent circuits such as combinations of lumped elements. For example, the quarter wave lines can be replaced by LC, pi- or T-networks with reactances equal in magnitude to the characteristic impedance of the replaced quarter wave line. T networks, L networks, single or in cascade can also be used, for example a line slightly shorter than a quarter wavelength can be synthesized by a quarter wavelength line with shunt inductors (coupled to RF ground) at each side, and a line longer than a quarter wavelength can be synthesized by a quarter wavelength line with shunt capacitors at each side.

The amplifier circuits according to embodiments of the present invention add an outphasing region above the lower outphasing region found in WO 2004/057755. Without other changes, this gives higher efficiency in the upper amplitude region but also allows re-dimensioning to improve the efficiency in the lower outphasing region, and hence, efficiency overall. It also has higher efficiency when designed for high PAR than the 3-stage amplifiers in the co-pending application P42029 being filed concurrently herewith.

The concepts described in the embodiments above can be extended to 4-stage (and higher) amplifiers, that can be constructed with both equal size and different size sub-amplifier pairs.

The amplifier circuits of the present invention are particularly suitable when transistors with very low shunt loss are employed, such as Laterally Diffused Metal Oxide Semiconductor (LDMOS) transistors at relatively low frequencies, or at higher frequencies with Gallium Nitride (GaN) or Gallium Arsenide (GaA) transistors.

In the embodiments described above it can be seen that the Chireix pair branches each consist of a higher-impedance and a lower-impedance transmission line of about equal length. The lengths of the first transmission lines from the branches sum to substantially a half wavelength, and that also applies to the second transmission lines. The third sub-amplifier is coupled by a quarter wavelength line to a junction from which it branches to the Chireix pair midpoint junctions. The lengths of these lines are three quarters of a wavelength minus the lengths of the lines from the midpoints to the output. The total length from the third sub-amplifier to the output through any path is equal to three quarter wavelengths.

The disclosed 4-stage embodiments retain the good efficiency of the 3-stage amplifiers and generally extend the high-efficiency regions to lower amplitudes In the embodiments described above, it is noted that a characteristic impedance of a first portion, e.g. $13_1$ is higher that the characteristic impedance of a second portion, e.g. $13_2$, of a transmission line, as represented by the relative thicknesses of the transmission lines (the smaller the thickness the higher the characteristic impedance, and vice versa). The characteristic impedance of a first portion of a first transmission line may be substantially N times the characteristic impedance of a second portion of the first transmission line and/or the characteristic impedance of a first portion of a second transmission line may be substantially N times the characteristic impedance of a second portion of a second transmission line.

In the embodiments described above it is noted that the various wavelengths are given as examples only, and that other values may be used without departing from the scope of the invention as defined in the appended claims.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier circuit comprising:
  a first amplifier configured to amplify a first input signal wherein an output of the first amplifier is coupled to an output node via a first transmission line, the first transmission line comprising a first portion having a first characteristic impedance and a first length, and a second portion having a second characteristic impedance and a second length;
  a second amplifier configured to amplify a second input signal, wherein an output of the second amplifier is coupled to the output node via a second transmission line, the second transmission line comprising a first portion having a first characteristic impedance and a first length, and a second portion having a second characteristic impedance and a second length; and
  an auxiliary amplifier configured to amplify a third input signal, wherein an output of the auxiliary amplifier is coupled to an auxiliary transmission line network comprising:
  a first auxiliary transmission line coupled between an auxiliary junction and a first intersection between the first and second portions of the first transmission line;
  a second auxiliary transmission line coupled between the auxiliary junction and a second intersection between the first and second portions of the second transmission line; and
  a third auxiliary transmission line for coupling the output of the auxiliary amplifier to the auxiliary junction;
  wherein for each of the first and second transmission lines the first and second portions consist of a higher-impedance portion and a lower-impedance portion whose lengths are substantially equal; and
  wherein the lengths of the respective first portions of the first and second transmission lines sum to half a wavelength, and the lengths of the respective second portions of the first and second transmission lines sum to half a wavelength.

2. The amplifier circuit as claimed in claim 1, wherein the length of each of the first and second auxiliary transmission lines is three quarters of a wavelength minus the length of the second portion of the respective transmission line which connects the auxiliary transmission line to the output.

3. The amplifier circuit as claimed in claim 2, wherein the total length from the auxiliary junction to the output through any path is equal to three quarter wavelengths.

4. The amplifier circuit as claimed in claim 1, wherein the third auxiliary transmission line for coupling the output of the auxiliary amplifier to the auxiliary junction comprises a quarter wavelength transmission line.

5. The amplifier circuit as claimed in claim 4, wherein the total length from the output of the auxiliary amplifier to the output through both its paths is equal to one wavelength.

6. The amplifier circuit as claimed in claim 1, wherein the first amplifier, second amplifier and auxiliary amplifier are of substantially the same size.

7. The amplifier circuit as claimed in claim 1, wherein the first amplifier and second amplifier are of substantially the same size, and the auxiliary amplifier increased in size compared to the first and second amplifiers.

8. The amplifier circuit as claimed in claim 7, wherein the auxiliary amplifier is increased in size by about 1.6 times, or by about 1.3 times, compared to the first and second amplifiers.

9. The amplifier circuit as claimed in claim 7, wherein an impedance of the third auxiliary transmission line is decreased relative to the impedance of a transmission line connected to the first or second amplifier, by an amount proportional to the increase in size of the auxiliary amplifier.

10. The amplifier circuit as claimed in claim 1, wherein a slight asymmetry is introduced into at least one of the transmission line lengths, such that the fixed equal lengths and half wavelength relationships are offset.

11. The amplifier circuit as claimed in claim 1, wherein the auxiliary amplifier comprises first and second auxiliary amplifiers, and wherein the first auxiliary amplifier is coupled via a fourth auxiliary transmission line to a third auxiliary transmission line, and the second auxiliary amplifier coupled via a fifth auxiliary transmission line to the third auxiliary transmission line.

12. The amplifier circuit as claimed in claim 11, wherein the first amplifier and second amplifier are of substantially the same size, and wherein the first auxiliary amplifier and second auxiliary amplifier are of substantially the same size but larger than the first and second amplifiers.

13. The amplifier circuit as claimed in claim 12, wherein the first and second amplifiers are about 50% of the size of the first auxiliary amplifier and second auxiliary amplifier.

14. The amplifier circuit as claimed in claim 11, wherein the first amplifier, second amplifier, first auxiliary amplifier and second auxiliary amplifier are of substantially the same size.

15. The amplifier circuit as claimed in claim 1, further comprising a fourth amplifier configured to amplify a fourth input signal, wherein an output of the fourth amplifier is coupled either directly to the output node, or via a half wavelength transmission line or multiple thereof.

16. A method in an amplifier circuit, the method comprising:
    amplifying a first input signal using a first amplifier, and coupling the amplified first input signal to an output node via a first transmission line, the first transmission line comprising a first portion having a first characteristic impedance and a first length, and a second portion having a second characteristic impedance and a second length;
    amplifying a second input signal using a second amplifier, and coupling the amplified second input signal to the output node via a second transmission line, the second transmission line comprising a first portion having a first characteristic impedance and a first length, and a second portion having a second characteristic impedance and a second length; and
    amplifying a third input signal using an auxiliary amplifier, and coupling the output of the auxiliary amplifier to an auxiliary transmission line network comprising:
    a first auxiliary transmission line coupled between an auxiliary junction and a first intersection between the first and second portions of the first transmission line;
    a second auxiliary transmission line coupled between the auxiliary junction and a second intersection between the first and second portions of the second transmission line; and
    a third auxiliary transmission line for coupling the output of the auxiliary amplifier to the auxiliary junction;
    wherein for each of the first and second transmission lines the first and second portions consist of a higher-impedance portion and a lower-impedance portion whose lengths are substantially equal; and
    wherein the lengths of the respective first portions of the first and second transmission lines sum to half a wavelength, and the lengths of the respective second portions of the first and second transmission lines sum to half a wavelength.

* * * * *